US010630271B2

(12) United States Patent
Sadowski

(10) Patent No.: US 10,630,271 B2
(45) Date of Patent: Apr. 21, 2020

(54) SELF TIMED DATA SAMPLER

(71) Applicant: Advanced Micro Devices, Inc., Sunnyvale, CA (US)

(72) Inventor: Greg Sadowski, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 23 days.

(21) Appl. No.: 15/239,209

(22) Filed: Aug. 17, 2016

(65) Prior Publication Data

US 2018/0054187 A1 Feb. 22, 2018

(51) Int. Cl.
*H03K 5/13* (2014.01)
*H03K 3/037* (2006.01)
*H03K 5/00* (2006.01)

(52) U.S. Cl.
CPC ............ *H03K 5/13* (2013.01); *H03K 3/0375* (2013.01); *H03K 2005/00013* (2013.01)

(58) Field of Classification Search
CPC ........... H03K 5/13; H03K 2005/00019; H03K 2005/00286; H03K 5/133; H03K 5/131; H03K 5/1534; H03K 19/018507; H03K 2005/00058; H03K 2005/00078; H03K 2005/00234; H03K 19/00; H03K 3/0375; H03K 2005/00013
See application file for complete search history.

(56) References Cited

U.S. PATENT DOCUMENTS

| | | | |
|---|---|---|---|
| 4,963,772 A | 10/1990 | Dike | |
| 5,036,221 A | 7/1991 | Brucculeri | |
| 6,066,965 A | 5/2000 | Blomgren et al. | |
| 7,977,976 B1 | 7/2011 | Tang | |
| 7,977,977 B1 | 7/2011 | Natarajan et al. | |
| 8,593,171 B2 | 11/2013 | Kosonocky et al. | |
| 9,123,439 B2 | 9/2015 | Pilo | |
| 9,552,892 B1 | 1/2017 | Kosonocky et al. | |
| 9,899,992 B1* | 2/2018 | Sadowski | H03K 3/0375 |
| 2004/0163022 A1 | 8/2004 | Whetsel | |
| 2005/0268265 A1* | 12/2005 | Ly | G06F 17/5022 716/108 |
| 2006/0076993 A1* | 4/2006 | Teo | H03K 5/13 327/165 |
| 2009/0024888 A1 | 1/2009 | Kurimoto | |
| 2010/0046683 A1* | 2/2010 | Beukema | H04L 7/0062 375/355 |
| 2010/0091688 A1 | 4/2010 | Staszewski | |
| 2012/0044009 A1 | 2/2012 | Hess | |
| 2012/0319781 A1 | 12/2012 | Scott | |
| 2013/0154712 A1 | 6/2013 | Hess | |
| 2014/0091998 A1 | 4/2014 | Ko | |

(Continued)

OTHER PUBLICATIONS

U.S. Appl. No. 15/239,217, filed Aug. 17, 2016, entitled "Low Power Adaptive Synchronizer", naming Greg Sadowski et al. as inventors.

*Primary Examiner* — Kenneth T Lam
(74) *Attorney, Agent, or Firm* — Zagorin Cave LLP

(57) ABSTRACT

A sampling circuit automatically resamples the data from another timing domain until the sampled data is represented correctly in the new domain by assuring that no metastable states exist. If a metastable state exists, a sampling signal recirculates through the sampling circuit until the metastable state no longer exists. A comparison of input data to sampled data is used to determine the existence of a metastable state.

22 Claims, 6 Drawing Sheets

(56) References Cited

U.S. PATENT DOCUMENTS

2014/0210516 A1* 7/2014 Hwang ............ H03K 19/18555
                                                                     326/80
2016/0359487 A1   12/2016 Nadkarni
2016/0378588 A1* 12/2016 Flautner .............. G06F 11/1604
                                                                     714/15

* cited by examiner

SELF TIMED DATA SAMPLER

STATEMENT REGARDING FEDERALLY SPONSORED RESEARCH OR DEVELOPMENT

This invention was made with Government support under Prime Contract Number DE-AC52-07NA27344, Subcontract No. B609201, awarded by the Department of Energy. The Government has certain rights in the invention.

BACKGROUND

Field of the Invention

This invention relates to adaptive handling of metastable events.

Description of the Related Art

Passing of signals between different timing domains, where the timing in one domain is not related or predictable in the other domain, is a challenging problem to solve. In existing solutions, synchronous (with global clock) circuits are used and data is synchronized with "brute force" synchronizers, which typically utilize a chain of flip-flops clocked with a synchronous clock. Every synchronizer circuit has a certain probability of entering a metastable state. The metastable state may be entered when a data transition occurs that violates the setup or hold time for the circuit. When a circuit enters a metastable state, its output is unstable and may oscillate between a logical 0 and a logical 1 or remain at a voltage level between a logical 0 and a logical 1. The circuit typically settles to either the 0 state or the 1 state but not necessarily the correct state.

FIGS. 1A and 1B illustrate the classic solution to deal with metastability that passes the asynchronous signal 101 through a synchronizer circuit 103 formed by a series of flip-flops 104 (FIG. 1B) clocked by a clock 105 associated with the synchronous domain 107. The synchronizer circuit 103 waits out the metastable state, if any, and supplies the synchronized output 106. The asynchronous logic function 109 supplies the asynchronous signal 101. The asynchronous logic function can be any function generating the asynchronous signal. For example, the asynchronous signal 101 can indicate that an instruction (e.g., a multiplication) has completed execution, or that a data packet has arrived, or that a condition exists such as a battery warning or thermal warning that requires action be taken.

The number of flip-flops in the chain in the synchronizer is determined by the metastable recovery time for a given flip-flop circuit and technology. One problem with using the brute force synchronizer approach is that the delay due to the chain of flip-flops is always present in the system whether the metastable state is entered or not. Thus, system performance is impacted by the presence of the synchronizer. In addition, when a flip-flop is in metastable state the flip-flop draws high current as both the upper and lower transistors are conducting.

More effectively dealing with metastability to improve system performance and reduce power consumption is desirable.

SUMMARY OF EMBODIMENTS OF THE INVENTION

Accordingly, in one embodiment a data sampler circuit includes a first data storage circuit coupled to receive input data and responsive to a data sample signal to sample the input data. A second data storage circuit is coupled to receive first output data from the first data storage circuit and is coupled to receive a delayed version of the data sample signal and supply second output data. A metastable detect circuit detects a metastable condition. An enable circuit is configured to enable the data sample signal responsive to detection of the metastable condition.

In another embodiment, a method of sampling includes sampling input data in a first data storage circuit responsive to a data sample signal and supplying first data. A second data storage circuit samples the first data responsive to a delayed version of the data sample signal and supplies second data. Existence of a metastable condition is determined by comparing the input data and the second data and an indication of the comparing is provided. A determination of existence of the metastable condition causes the data sample signal to be reasserted.

In another embodiment a method is provided that includes recirculating a data sample signal in a data sampling circuit to resample input data until a metastable condition is determined to not exist.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Instead of using a chain of flip-flops or latches to synchronize an unknown timing signal to a synchronous domain, an embodiment uses a data storage circuit (e.g., a latch or flip-flop) to synchronize the asynchronous signal and that data storage circuit is given as much time as needed to recover from a metastable state. The output of the first data storage circuit is supplied to an output data storage circuit (e.g., a flip-flop or latch) having a gated clock or enable signal. Eliminating other data storage circuits from the chain saves power as a data storage circuit in a metastable state can consume a lot of power by operating in the linear mode with both transistors conducting. In embodiments herein, if a metastable condition is determined to exist, the clock or enable signal to the output flip-flop or latch is gated off.

Figure 1A:
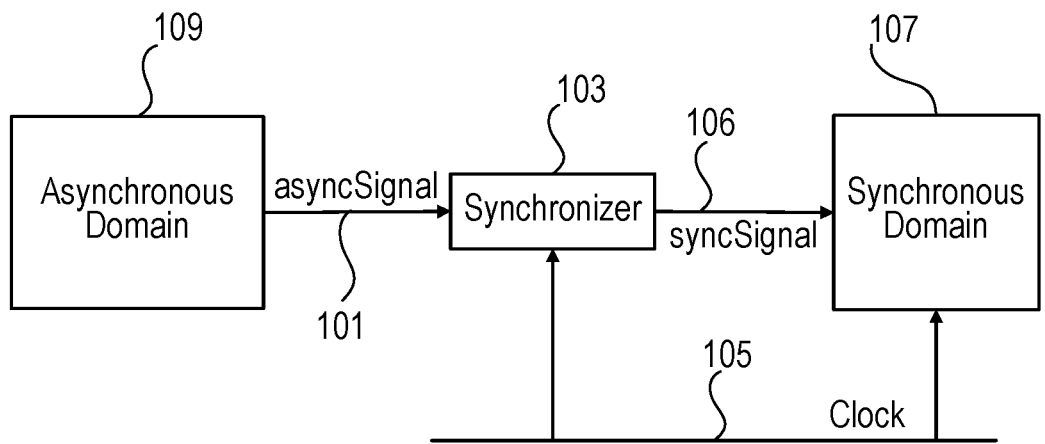
FIG. 1A illustrates an embodiment of a system supplying a signal from an asynchronous domain to a synchronous domain.
Figure 1B:
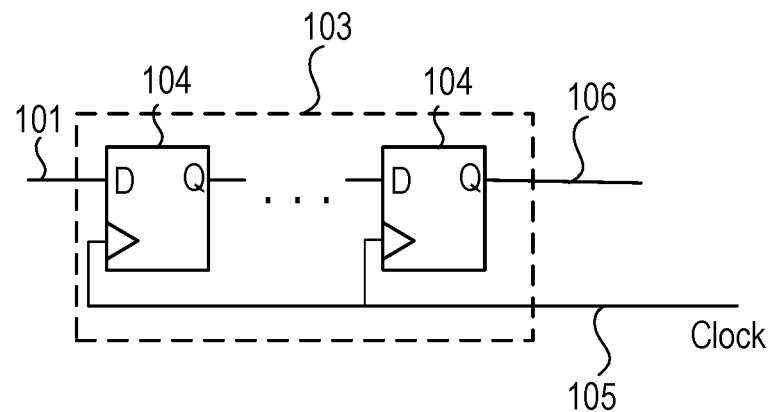
FIG. 1B illustrates an embodiment of a synchronizer that may be used in the system of FIG. 1A.
Figure 2:
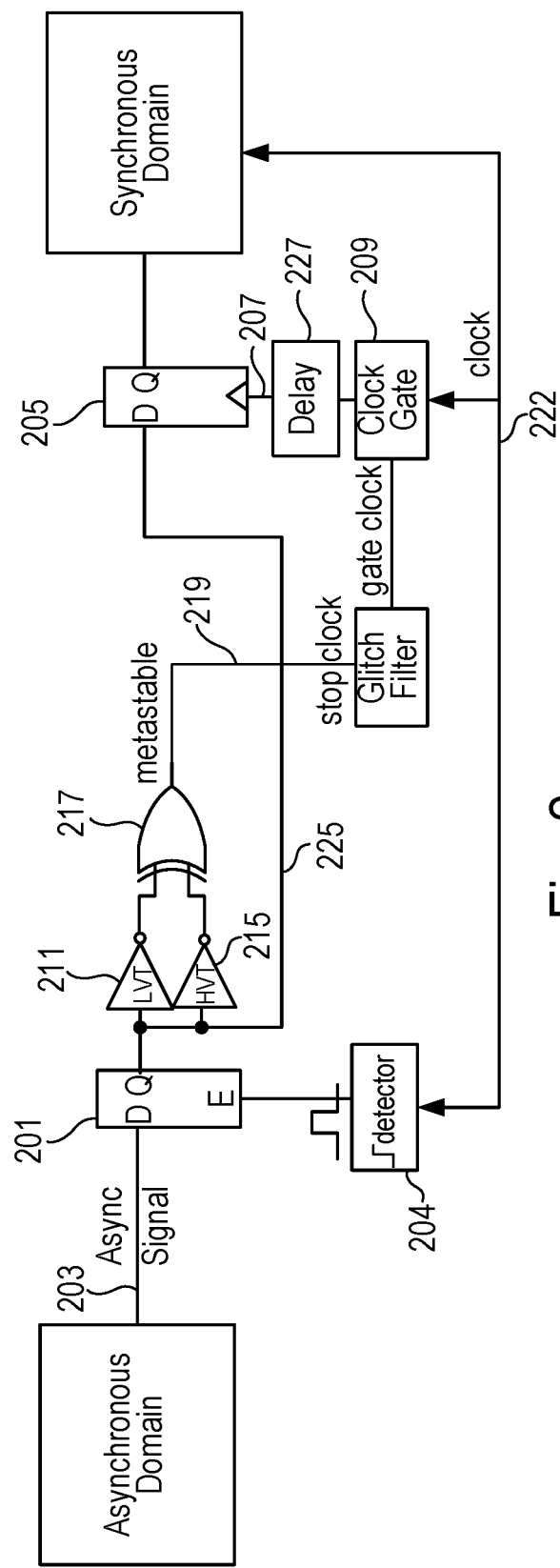
FIG. 2 illustrates an embodiment of a circuit that detects a metastable state.

FIG. 2 illustrates an embodiment with a latch 201 that receives an asynchronous signal 203. Latch 201 synchronizes the asynchronous signal 203 to a synchronous clock 222. The latch 201 is transparent when its enable "E" input is HIGH. The latch 201 drives the output flip-flop 205 that has a clock signal 207 supplied from clock gating logic 209 (through delay 227). The flip-flop 205 should not enter a metastable state because its clock will be gated off if a metastable state is detected. If there is no metastable state involved in the cycle, the latched signal will go right through the flip-flop with just one clock cycle delay. Rising edge detector 204 generates a latch enable pulse (compliant with pulse width requirements) every time the clock transitions from LOW to HIGH.

Figure 3:
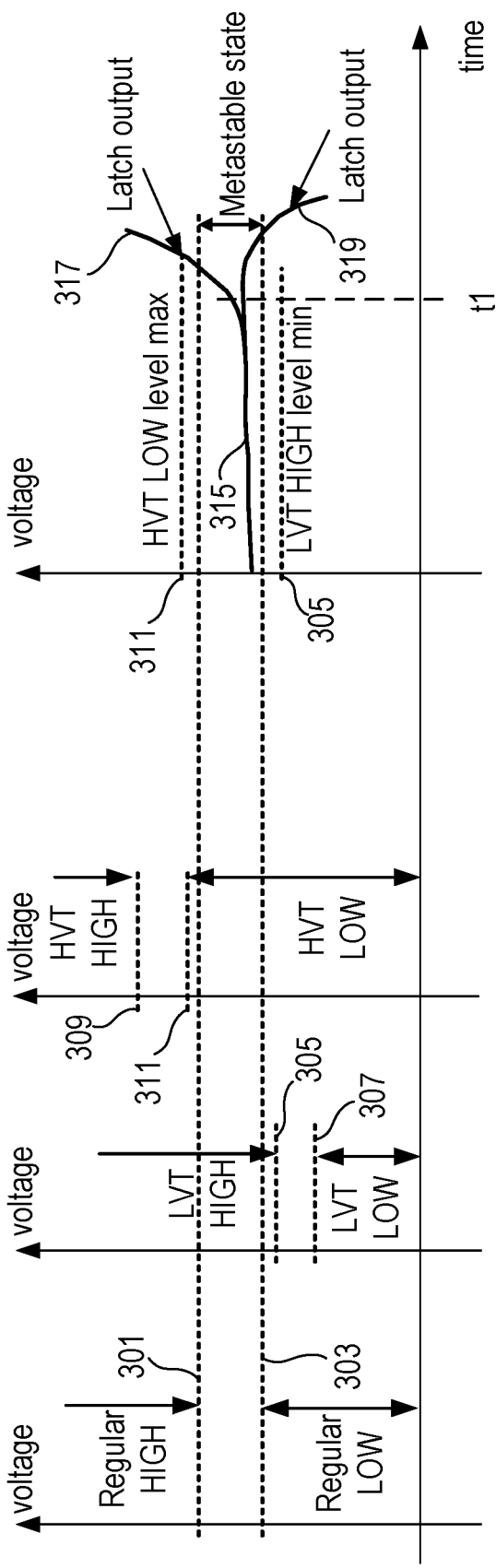
FIG. 3 graphically illustrates operation of the inverters of FIG. 2.

In an embodiment, two inverters and compare logic detect a metastable state in the latch. Inverter 211 is a very low switching voltage threshold (LVT) device and inverter 215 is a very high switching voltage threshold (HVT) device. Both inverters receive the output of latch 201. The techniques for designing such LVT and HVT inverter devices are well known. FIG. 3 illustrates operation of the LVT and HVT devices when the latch output is at the metastable level between the "regular" voltage values of HIGH and LOW. The "regular" level is the voltage level that typical devices in the circuit will consider HIGHs or LOWs. Referring to FIG. 3, the regular HIGH voltage level is shown at 301 and the regular LOW voltage level is shown at 303. The HIGH and LOW LVT values are shown at 305 and 307. The HIGH and LOW HVT values are shown at 309 and 311. When latch 201 is metastable, and its output voltage is somewhere between the "regular" values of HIGH and LOW, e.g., at voltage level 315, the LVT inverter 211 recognizes the metastable voltage level 315 as a HIGH input level since the LVT HIGH level minimum voltage threshold 305 has been crossed, and outputs a logical LOW (the inverted value of the input). The HVT inverter 215 recognizes a LOW input level as voltage level 315 is below the HVT LOW level maximum value 311 and outputs a logical HIGH. As a consequence the output of the XOR gate 217 in FIG. 2 will be a logic HIGH indicating the first latch is in a metastable state since the output of the two inverters are different. If the "metastable" output of XOR 217 is HIGH, the latch 201 is metastable and the output of latch 201 should not be clocked into the output flip-flop 205. Accordingly, the metastable indication 219 is used to gate off the clock signal 222 in clock gate logic 209. FIG. 3 also shows the latch output beginning to resolve at time t1 towards either a HIGH value 317 or a LOW level 319.

While FIG. 2 illustrates data storage circuit 201 implemented as a level sensitive latch receiving an enable signal, and data storage circuit 205 as an edge-triggered device receiving a clock signal, other embodiments may utilize an edge triggered device (e.g., a flip-flop) in place of latch 201 and/or a level sensitive device (e.g., a latch) in place of flip-flop 205. In that case, rather than gating off a clock signal to flip-flop 205, such an embodiment would gate off an enable signal to the output data storage circuit implemented as a latch.

Figure 4:
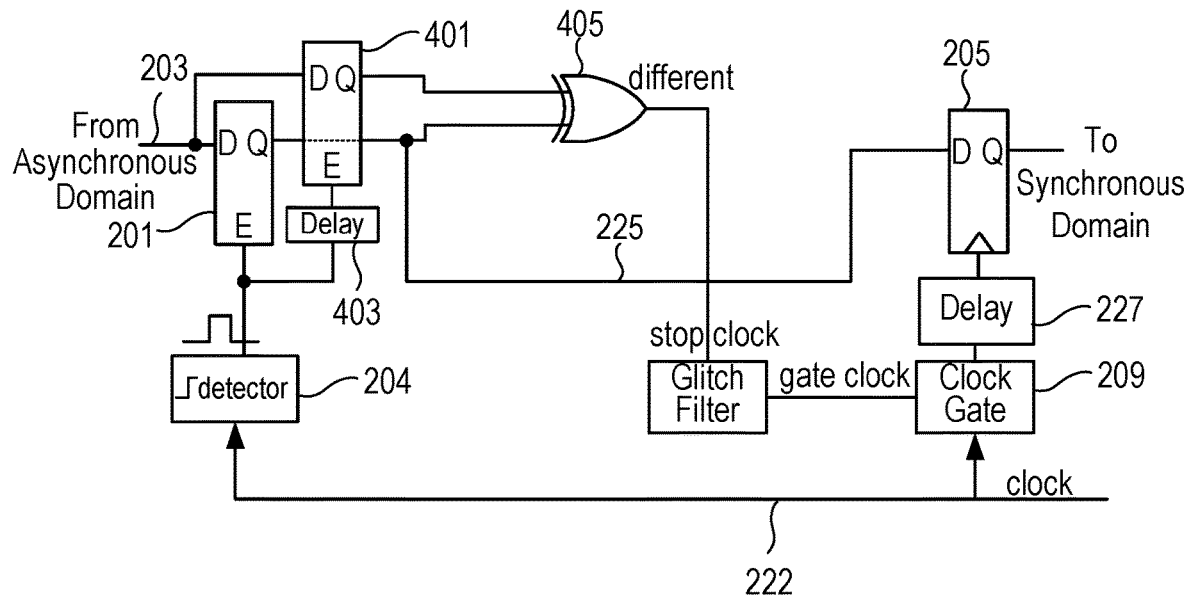
FIG. 4 illustrates an embodiment of a circuit that detects a metastable state that may have resolved to the wrong value.

In addition to the metastable state being detected using the two inverters, an embodiment illustrated in FIG. 4 uses two latches 201 and 401 and drives them with the same asynchronous input signal 203, but enables latch 401 with a delayed latch enable pulse. Thus, delay 403, which may be implemented as a plurality of inverters, delays the latch enable. The delay value is selected such that only one of the latches can ever be in metastable state. When the asynchronous input signal 203 transitions within the "forbidden" window of one of the latches, then the transition is outside of the window of the second latch. In the embodiment of FIG. 4, the output of latch 201 drives the input of the output flip-flop 205, which clock is clock gated using clock gate logic 209, an embodiment of which is described in more detail herein.

In the embodiment of FIG. 4, at least one of the latches is always right, but it is not known which one. If both latches agree (the outputs are at the same logic level) clock gate 209 enables the clock 222 to output flip-flop 205 to clock in the synchronized data 225. If the "different" XOR 405 output is HIGH, the outputs of latches 203 and 401 are different because one of them is metastable or one of them has already resolved the metastable state to a wrong logic level. If the output is HIGH, the clock gate 209 gates off the clock to output flip-flop 205. In other embodiments, the latches 201 and 401 may be implemented as edge triggered devices rather than latches.

Figure 5:
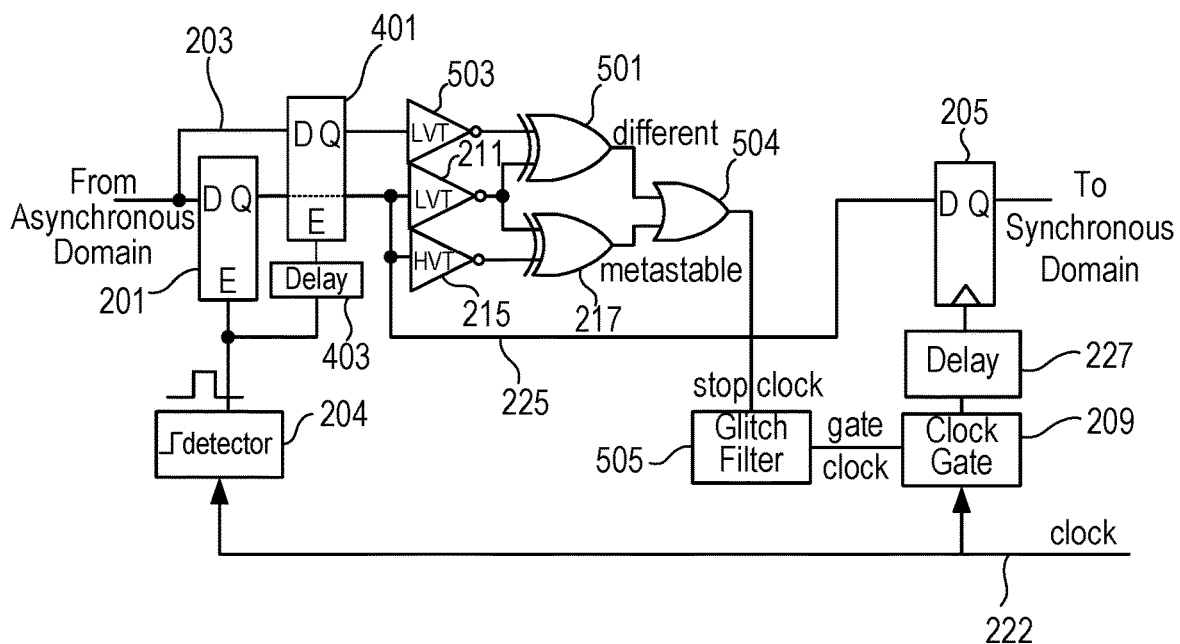
FIG. 5 illustrates an embodiment that includes a circuit that detects a metastable state using inverters and a circuit that detects a metastable state that may have resolved to the wrong value by comparing latch outputs.

Referring to FIG. 5 a more robust embodiment is shown in which the metastable state detector circuits inhibit passing of the metastable state to circuits that follow, by clock gating the output stage (flip-flop 205). In order to determine whether or not to gate off the clock of the output flip-flop, the embodiment of FIG. 5 uses two detect circuits. One circuit detects metastability and another circuit detects resolved metastability but to a wrong logic level. The embodiment of FIG. 5 combines the results from both detector circuits and uses that signal (through a filter) to gate off the next clock cycle if a metastable condition is detected, waiting for the metastable situation to be resolved, which may occur at the next clock cycle, or later. The synchronizer delay between arrival of the signal 203 and its appearance on the output of flip-flop 205 is a multiple of clock cycles. The delay can be, e.g., one, two, or three clock cycles with a decreasing probability of latch 201 or latch 401 remaining in metastable state as the number of cycles increase. In the extreme case, the synchronizer becomes metastable indefinitely.

The embodiment of FIG. 5 combines the two approaches illustrated in FIG. 2 and FIG. 4. Thus, one circuit compares the output of the latches to detect metastability that has been resolved to the wrong value in one of the latches and another circuit compares the output of the LVT and HVT inverters to detect a metastable condition indicated by the latch output being between "legal" HIGH and LOW voltage values. Note that the "forbidden" time window in the embodiments of FIGS. 4 and 5 is twice as wide due to the two latches, so the probability of clock gating the output flip-flop increases as compared to an embodiment with a single latch such as shown in FIG. 2. As in the embodiments shown in FIGS. 2 and 4, edge triggered devices may be substituted for level sensitive devices and vice versa. Note that the timing and performance would be similar for embodiments using latches with narrow pulses for enable signals and embodiments using flip-flops clocked with the falling edge of the clock.

The LVT inverter 211 and the HVT inverter 215 are compared in XOR gate 217. The two latches 201 and 401 are compared in XOR gate 501. Note that the output of latch 401 is supplied to XOR gate 501 through an LVT inverter 503. In other embodiments, LVT inverter 503 could be replaced by an HVT inverter and inverter 215 and 211 would switch places.

Figure 6:
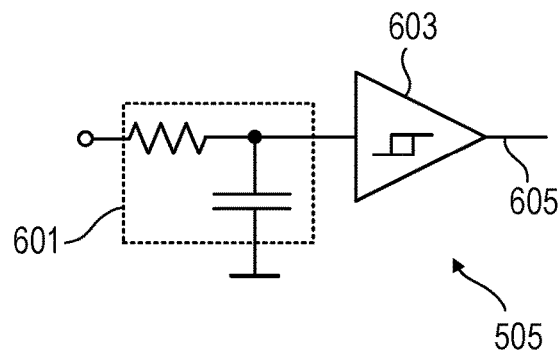
FIG. 6 illustrates an embodiment of a filter circuit.

The two conditions are combined in OR gate 504, such that if either the "metastable" indication from XOR gate 217 is asserted or the "different" indication from XOR gate 501 is asserted, the OR gate 504 asserts a gating signal to gate off clock 222 being supplied to output latch 205. The output of the OR gate 503 is supplied to clock gate logic 209 through the glitch filter 505. The "glitch filter" circuit 505 removes narrow pulses and passes only signals that are at least minimum width signals. FIG. 6 illustrates an example of a glitch filter using an RC filter 601 and a Schmitt trigger buffer 603. If the "stop clock" signal width is too narrow and gets removed by the filter, it means that the metastability state was short. The filter width is adjustable by adjusting the RC filter.

Figure 7:
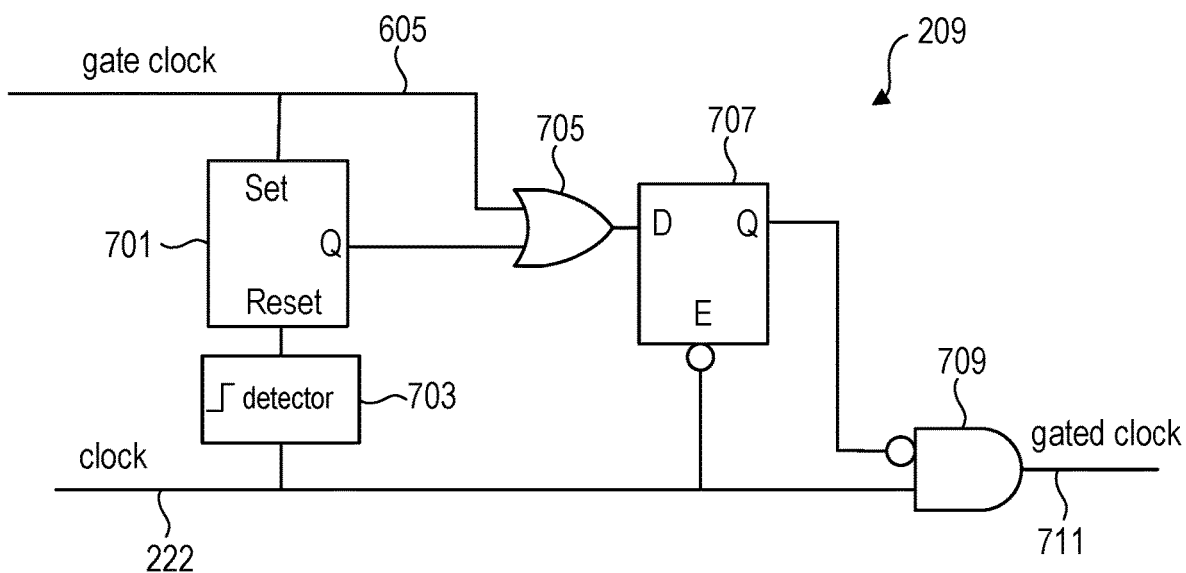
FIG. 7 illustrates an embodiment of a clock gate circuit.

The output 605 of the glitch filter is supplied to clock gate circuit 209. FIG. 7 illustrates an example of the clock gate circuit 209. The output 605 (gate clock) of the glitch filter 505 that requests gating of the clock signal when asserted, is supplied to the set input of RS latch 701 and to OR gate 705. The rising edge detector 703 resets the RS latch 701 on the rising edge of the clock signal 222. OR gate 705 combines the gate clock signal 605 and the output of RS latch 701 and supplies the input of latch 707. The latch enable signal (E) is inverted causing a half cycle delay from the rising edge of the clock signal. The latch 707 is enabled using an inverted version of the clock signal in order to drive the gated clock signal 711 to a LOW logic level (gate the clock responsive to the gate clock signal 605 being asserted) only during the LOW level of the clock in order to prevent glitches in the gated clock signal 711. The output of latch 707 is supplied to AND gate 709 that gates the clock signal off if the output of latch 707 is HIGH and otherwise passes the clock signal 222. The gated clock signal 711 is supplied by the clock gate logic 209 to the delay circuit 227 (see FIGS. 2, 4 and 5), which delays the clock signal to ensure it is well aligned with the data supplied from latch 203.

Thus, in the illustrated embodiments, only one latch may enter the metastable state in which high current is drawn, as opposed to a series of flip-flops in a traditional synchronizer. That provides a power savings. Further, the circuit delay is adaptive to occurrence of metastable states. Thus, the approach increases system performance since most of the time metastability does not occur and the delay through the synchronizer is just one clock cycle.

Figure 8:
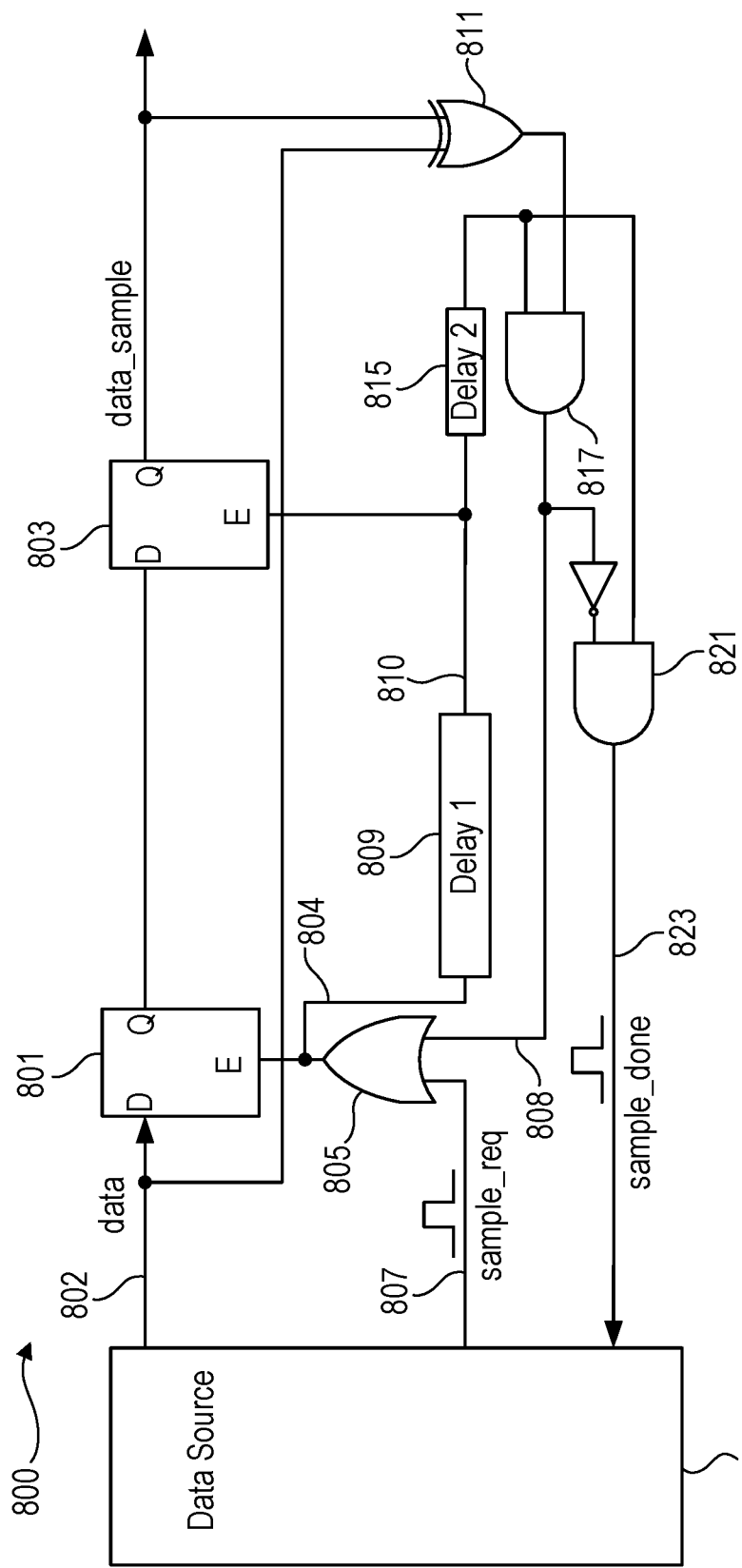
FIG. 8 illustrates an embodiment of a self-timed data sampling circuit that recirculates a latch enable signal if a metastable condition is detected.

FIG. 8 illustrates another embodiment for a circuit that is adaptive to the occurrence of metastable states. The embodiment shown in FIG. 8 provides a low power and area circuit 800 that automatically resamples the data from another timing domain until the sampled data is represented correctly in the new domain. The circuit may be very useful for implementation in Internet of Things (IoT) applications, where cost, area, and power are very important, and which often deal with interfacing to different types of environments, often running in different timing domains.

Referring to FIG. 8, circuit 800 samples input data asynchronously until the data is stable and then provides an acknowledge signal indicating that the data is stable. The next data and the next sampling pulse may then be provided to circuit 800. Latch 801 samples the input data 802 using the sampling pulse 804 provided by OR gate 805. The sampling pulse is a narrow sampling pulse that is wide enough to satisfy the minimum pulse width of the latch enable signal as well as wide enough to propagate through the delay lines. The OR gate 805 receives one input from the sample request signal line (sample_req) 807 and another input 808 that is a recirculated sample request signal line. The sample request 807 can be generated from a clock signal (synchronous circuit) or from any global clock asynchronous circuit.

The latch 803 samples the output of latch 801 after a delay 809 using the delayed sampling pulse 810. Latch 801 may become metastable at most every mean time between failure (MTBF) time interval. The Delay 1 component 809 allows enough time for any metastability to resolve (enough for a given MTBF requirement) before the data from the first latch is transferred to the second latch 803. XOR gate 811 receives the input data 802 and the output of latch 803 and provides a comparison indication. XOR gate 811 provides a LOW output if the input data 802 agrees with the data from latch 803. The Delay 2 component 815 is a matching delay to match the path of E-to-Q of latch 803 and XOR gate 811 so that the enable pulse for latch 803 reaches AND gate 817 at the same time as the output of the XOR gate 811. If the XOR gate 811 indicates a miscompare (XOR ouput HIGH) then the sampling pulse is recirculated through AND gate 817 and OR gate 805 to resample the input data 802 in latch 801. Thus, the initial sampling pulse circulates until the latched data in 803 equals the original data input. If the first latch entered the metastable state and then resolved to a wrong value, then the data will be re-sampled by the recirculated pulse. If the sampled data in latch 803 agrees with the input data, then AND gate 821 converts the delayed sampling pulse from the Delay 2 component 815 to an acknowledge signal (sample_done) 823.

Just one sampling pulse 807 is sent to circuit 800 until an acknowledge signal 823 (sample_done) is sent back to data source 825. When the acknowledge signal arrives, the correct data is known to have been latched and data source 825 can issue the next data sample and another sampling pulse to sample the next data sample. The samples can be issued frequently enough to satisfy the sampling theorem, which is that the sampling frequency should be at least twice the highest data frequency. Effectively, a variable sampling frequency is being used, as metastability may or may not be entered and therefore the sampling may take multiple attempts. Therefore the circuit that generates the sampling pulses needs to account for the number of sampling pulses during some time period, so the number of pulses complies with the requirements of the sampling theorem. In cases when the average sampling frequency is low, the sampled data may occasionally differ from the original due to metastability happening at random.

While FIG. 8 illustrates storage elements as latches 801 and 803, other embodiments may use edge triggered devices (e.g., flip-flops) or other kinds of storage devices as storage elements in place of the latches 801 and 803. In an embodiment using flip-flops for storage elements 801 and 803, the storage elements 801 and 803 respectively sample at the rising (or falling) edge of the sampling pulse 804 and the delayed sampling pulse 810 instead of in response to the level of sampling pulse 804 and delayed sampling pulse 810. Similar performance can be achieved using flip-flops or latches, especially when the latch enable signals are narrow pulses.

Thus, embodiments for adapting to the existence of metastability has been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A data sampler circuit comprising:
   a first data storage circuit coupled to receive input data from a data source and responsive to a data sample signal to sample the input data;
   a second data storage circuit coupled to receive first output data from the first data storage circuit and coupled to receive a delayed version of the data sample signal and supply second output data;
   a metastable detect circuit coupled to receive the input data and the second output data and to detect a metastable condition;
   an enable circuit configured to assert the data sample signal responsive to detection of the metastable condition; and
   wherein the enable circuit is further responsive to a sample request signal supplied from the data source to assert the data sample signal.

2. The data sampler circuit as recited in claim 1 wherein the first and second data storage circuits are latch circuits and the data sample signal is a level sensitive latch enable signal.

3. The data sampler circuit as recited in claim 1 wherein the metastable detect circuit comprises:
   a logic circuit configured to compare the input data with the second output data and supply a metastable indication with a first value indicating a metastable condition if the compare indicates a difference between the input data and the second output data, and the logic circuit is configured to supply the metastable indication with a second value indicating no metastable condition if the compare indicates no difference between the input data and the second output data.

4. The data sampler circuit as recited in claim 3 wherein the logic circuit comprises an XOR gate coupled to receive the input data and the second output data.

5. The data sampler circuit as recited in claim 3 further comprising:
   a first delay circuit having a delay input coupled to an output of the enable circuit and having a delay output coupled to supply the delayed version of the data sample signal to the second data storage circuit.

6. The data sampler circuit as recited in claim 5 further comprising:
   a second delay circuit coupled between the delay ouput and the enable circuit to generate a twice delayed version of the data sample signal.

7. The data sampler circuit as recited in claim 6 wherein the enable circuit comprises:
   a first logic circuit to logically combine the metastable indication and an output of the second delay circuit; and
   a second logic circuit to logically combine an output of the first logic circuit and the sample request signal from the data source.

8. The data sampler circuit as recited in claim 6 further comprising:
   a sample done circuit to supply a sample done signal to the data source indicating the input data has been sampled with no metastable condition; and
   wherein the sample done circuit utilizes the twice delayed version of the data sample signal to generate the sample done signal.

9. The data sampler circuit as recited in claim 1 further comprising:
   a sample done circuit to supply a sample done signal to the data source indicating the input data has been sampled with no metastable condition.

10. A method of sampling a signal comprising:
    sampling input data in a first data storage circuit responsive to a data sample signal and supplying first data;
    sampling the first data in a second data storage circuit responsive to a delayed version of the data sample signal and supplying second data;
    determining if a metastable condition exists by comparing the input data and the second data and providing a metastable indication indicative of the comparing;
    recirculating the data sample signal to generate a recirculated data sample signal responsive to the metastable indication indicating existence of the metastable condition; and
    resampling the input data in the first data storage circuit responsive to the recirculated data sample signal.

11. The method as recited in claim 10 further comprising if the comparing indicates a difference between the input data and the second data providing the metastable indication with a first value indicating the metastable condition exists and if the comparing indicates no difference between the input data and the second data providing the metastable indication with a second value indicating no metastable condition exists.

12. The method as recited in claim 10 wherein generating the data sample signal comprises:
    logically combining the metastable indication and a twice delayed data sample signal and generating a resample indication signal indicating whether the input data should be resampled; and
    logically combining the resample indication signal and a sample request signal to generate the data sample signal.

13. The method as recited in claim 12 further comprising:
    generating a sample done signal indicating that the input data has been sampled with no metastable condition detected.

14. The method as recited in claim 13 further comprising:
    generating the sample done signal using the twice delayed data sample signal.

15. The method as recited in claim 13 further comprising:
    sending another sampling pulse to sample next data responsive to receiving the sample done signal.

16. The method as recited in claim 10 wherein the first data storage circuit is a first latch and the second data storage circuit is a second latch and the data sample signal is a level sensitive latch enable signal and the delayed version of the data sample signal is a delayed latch enable signal.

17. The method as recited in claim 10 further comprising:
    generating a sample done signal indicating that the input data from a data source has been sampled with no metastable condition detected; and
    supplying the sample done signal to the data source.

18. A method comprising:
    recirculating a data sample signal in a data sampling circuit to resample input data from a data source until a metastable condition is determined to not exist; and
    sending an acknowledge signal to the data source to indicate that correct input data has been stored.

19. The method as recited in claim 18 further comprising:
    generating the data sample signal by logically combining an input data sample request signal from the data source and a recirculated data sample signal;

sampling the input data in a first data storage circuit responsive to the data sample signal and generating first output data;

delaying the data sample signal and supplying a delayed data sample signal;

sampling the first output data in a second data storage circuit responsive to the delayed data sample signal and supplying second output data; and determining if the metastable condition exists by comparing the input data with the second output data.

20. The method as recited in claim 18 further comprising stopping recirculating the data sample signal when the metastable condition is determined not to exist.

21. The method as recited in claim 18 further comprising generating the acknowledge signal from a logical combination of a delayed version of the data sample signal and an indication that the metastable condition no longer exists.

22. The method as recited in claim 18 wherein the data source is in a different clock domain than the data sampling circuit.

* * * * *